(12) United States Patent
Kanou (10) Patent No.: US 8,897,031 B2
(45) Date of Patent: Nov. 25, 2014

(54) ELECTRONIC UNIT CASE AND METHOD OF MANUFACTURING ELECTRONIC UNIT

(75) Inventor: Takehiro Kanou, Yokkaichi (JP)

(73) Assignee: Sumitomo Wiring Systems, Ltd, Mie (JP)

( * ) Notice: Subject to any disclaimer, the term of this patent is extended or adjusted under 35 U.S.C. 154(b) by 82 days.

(21) Appl. No.: 13/516,553

(22) PCT Filed: Jul. 6, 2011

(86) PCT No.: PCT/JP2011/003860
§ 371 (c)(1),
(2), (4) Date: Jun. 15, 2012

(87) PCT Pub. No.: WO2012/111048
PCT Pub. Date: Aug. 23, 2012

(65) Prior Publication Data
US 2012/0262892 A1    Oct. 18, 2012

(30) Foreign Application Priority Data
Feb. 14, 2011   (JP) .................................. 2011-028603

(51) Int. Cl.
| | |
|---|---|
| *H05K 7/14* | (2006.01) |
| *H05K 5/00* | (2006.01) |
| *H02B 1/26* | (2006.01) |
| *H01J 5/00* | (2006.01) |
| *H01R 13/46* | (2006.01) |

(52) U.S. Cl.
CPC ............ *H05K 5/0013* (2013.01); *H05K 5/0056* (2013.01); *H05K 5/006* (2013.01); *H05K 5/0052* (2013.01)

USPC ............ 361/796; 361/752; 361/641; 174/50; 174/58; 174/59; 174/60

(58) Field of Classification Search
USPC ......... 174/50, 520, 559, 58, 59, 60; 439/76.1, 439/76.2, 535; 220/4.02; 361/641, 752, 796
See application file for complete search history.

(56) References Cited

U.S. PATENT DOCUMENTS 6,671,183 B2 * 12/2003 Tsuzuki ........................ 361/797
2010/0073901 A1    3/2010 Suzuki et al.

FOREIGN PATENT DOCUMENTS

| | | |
|---|---|---|
| JP | 2003-099728 | 4/2003 |
| JP | 2003-209383 | 7/2003 |

* cited by examiner

*Primary Examiner* — Hoa C Nguyen
*Assistant Examiner* — Binh Tran
(74) *Attorney, Agent, or Firm* — Greenblum & Bernstein, P.L.C.

(57) ABSTRACT

A case includes a case body and a cover member. The case body includes a bottom wall portion having a surface area which allows selective accommodation of a first substrate and a second substrate and an outer peripheral portion. The outer peripheral portion includes a front wall portion (a reference wall portion), a pair of left and right wall portions which come into abutment with lateral sides of the first and second substrates, and ribs (first restraint portions) configured to restrain the first substrate in cooperation with the front wall portion at a position where a reference side of the first substrate comes into abutment with the front wall portion. The case body includes a diaphragm (a second restraint portion) configured to restrain the second substrate in cooperation with the front wall portion at a position where a reference side of the second substrate comes into abutment with the front wall portion.

7 Claims, 9 Drawing Sheets

ELECTRONIC UNIT CASE AND METHOD OF MANUFACTURING ELECTRONIC UNIT

TECHNICAL FIELD

The present invention relates to an electronic unit case suitable for an electronic unit such as an electronic control unit (ECU; Electronic Control Unit) to be mounted on a vehicle and a method of manufacturing the electronic unit.

BACKGROUND ART

In the related art, as an electronic control unit (an electronic unit) for controlling various types of electrical components to be mounted on a vehicle, for example, the one described in Patent Document 1 is known. Commencing with the electronic control unit described in Patent Document 1, the electronic control unit of this type generally includes a substrate on which a connector for external connection is mounted, and a case configured to accommodate the substrate. The case includes a case body configured to accommodate the substrate and a cover member to be mounted on the case body. The substrate is fixed to the case body with screws, or fixed to the case body, for example, by being press-fitted to the inside of plural ribs formed on the case body, and is accommodated in the case from an opening or the like formed on the cover member in a state in which the connector is exposed to the outside.

The electronic control unit is assembled to a J/B (Junction Box: electric connection box), and is assembled to a vehicle in a state in which the connector and a connector on the J/B side are directly connected in many cases. In contrast, details of control of the electronic control units are different depending on the grades of the vehicle or selected options, so that different types of substrates are required to be mounted correspondingly. In this case, when mounting of the substrates different in size is required, plural types of cases different in internal shape such as screw holes for fixing the substrate or positions of ribs from each other while being common in outline shape (the size and the shape) are prepared, and these cases are selectively used in accordance with the sizes of the substrates.

However, when selectively using plural types of specific cases as described above, plural dies are required for molding the cases, which is disadvantageous in terms of manufactures' costs. Also, it is required to manage plural types of cases common in outline shape of the cases, and hence component management is complicated. In addition, when plural different types of cases are mixed, the assembly work of the electronic control unit may be affected.

CITED REFERENCE

Patent Document

Patent Document 1: JP-A-2003-209383

SUMMARY OF INVENTION

In view of such circumstances, it is an object of the present invention to provide an electronic unit case and a method of manufacturing the electronic unit which may contribute to reduction of cost of the electronic unit such as a vehicle-mounted electronic control unit, alleviation of a burden of component management, and improvement of assemblability.

In order to achieve the above-described object, the electronic unit case according to the present invention is an electronic unit case which constitutes an electronic unit together with a first substrate and a second substrate and has a shape allowing selective accommodation of either one of the first substrate and the second substrate, the first substrate having a first reference side, a first opposed side parallel to the first reference side and opposing the first reference side, and a pair of first lateral sides extending between the first reference side and the first opposed side in the direction orthogonal to the first reference side and the first opposed side and opposing each other, and allowing mounting of a first connector for the external connection along the first reference side, and the second substrate having a second reference side and a second opposed side equivalent to the first reference side and the first opposed side, and a pair of second lateral sides extending between the second reference side and the second opposed side in the direction orthogonal to the second reference side and the second opposed side, opposing each other, and having a dimension larger than that of the first lateral side, and allowing mounting of a second connector for the external connection in a relative positional relationship with respect to the second reference side equivalent to the relative positional relationship between the first reference side and the first connector, including: a case body opening in the direction parallel to the direction of normal lines of the first substrate and the second substrate, and has a shape which can restrain both of the first substrate and the second substrate in the direction orthogonal to the direction of the normal lines; a cover member to be mounted on the case body so as to close the opening, wherein the case body includes: a bottom wall portion having a surface area which can selectively accommodate the first substrate and the second substrate, and including a substrate supporting portion configured to support the accommodated substrate from the side opposite from the opening; and a peripheral wall portion extending upright from the bottom wall portion and having a shape which can surround both of the first substrate and the second substrate; the peripheral wall portion includes: a reference wall portion configured to come into abutment with the first reference side or the second reference side from the outside for positioning the same; a pair of side wall portions configured to come into abutment with the first lateral side or the second lateral side from the outside for positioning the same; a first restraint portion configured to restrain the first substrate in cooperation with the reference wall portion by coming into abutment with the first opposed side of the first substrate from the outside at a position where the first reference side of the first substrate comes into abutment with the reference wall portion; and a second restraint portion located at a position farther from the reference wall portion than the first restraint portion and configured to restrain the second substrate in cooperation with the reference wall portion by coming into abutment with the second opposed side of the second substrate from the outside at a position where the second reference side of the second substrate comes into abutment with the reference wall portion, and the first restraint portion has a discontinuous shape between the both side wall portions and a shape allowing the second substrate to continue in the direction parallel to the second lateral side in an area where the first restraint portion is not present.

Also, a method of manufacturing an electronic unit according to the present invention is a method of manufacturing a first electronic unit and a second electronic unit, including: a case manufacturing step for manufacturing the electronic unit case; a first substrate manufacturing step for manufacturing the first substrate having a first reference side, a first opposed side parallel to the first reference side and opposing the first reference side, and a pair of first lateral sides extending between the first reference side and the first opposed side in the direction orthogonal to the first reference side and the first opposed side and opposing each other, and allowing mounting of a first connector for the external connection along the first reference side, the first substrate including the first reference side and the first opposed side having a dimension which allows press-fitting into a space between a pair of side wall portions of the case body of the electronic unit case, and the pair of first sides have a dimension which allows press-fitting into a space between the reference wall portion and the first restraint portion of the case member; a second substrate manufacturing step for manufacturing the second substrate having the second reference side and a second opposed side equivalent to the first reference side and the first opposed side, and a pair of second lateral sides extending between the second reference side and the second opposed side in the direction orthogonal to the second reference side and the second opposed side, opposing each other, and having a dimension which can be press-fitted into a space between the reference wall portion and the second restraint portion of the case body of the electronic unit case, allowing a second connector for the external connection in a relative positional relationship with respect to the second reference side equivalent to the relative positional relationship between the first reference side and the first connector, the second substrate being formed with a notch or an opening which is capable of avoiding interference with the first restraint portion of the case body; a first unit assembling step for assembling the first electronic unit in which the first substrate is accommodated by press-fitting the first substrate inside the reference wall portion, the first restraint portion, and the pair of the side wall portions in a state in which the first reference side is in abutment with the reference wall portion, and mounting the cover member on the case body; and a second unit assembling step for assembling the second electronic unit in which the second substrate is accommodated by press-fitting the second substrate inside the reference wall portion, the second restraint portion and the pair of side wall portions in a state in which the second reference side is in abutment with the reference wall portion, and mounting the cover member on the case body.

According to the electronic unit case and a method of manufacturing the electronic unit as described above, the first and second electronic units in which the substrates (the first substrate, the second substrate) having different sizes (surface areas) are accommodated can be produced efficiently using the common electronic unit cases.

BRIEF DESCRIPTION OF THE DRAWINGS

FIG. 7 is a substantial plan view showing types of the substrates to be accommodated in the electronic control unit and, 7(a) shows the first substrate, and 7(b) shows the second substrate, respectively.

MODES FOR CARRYING OUT THE INVENTION

Referring now to the attached drawings, a mode of preferable embodiment of the present invention will be described in detail.

Figure 1:
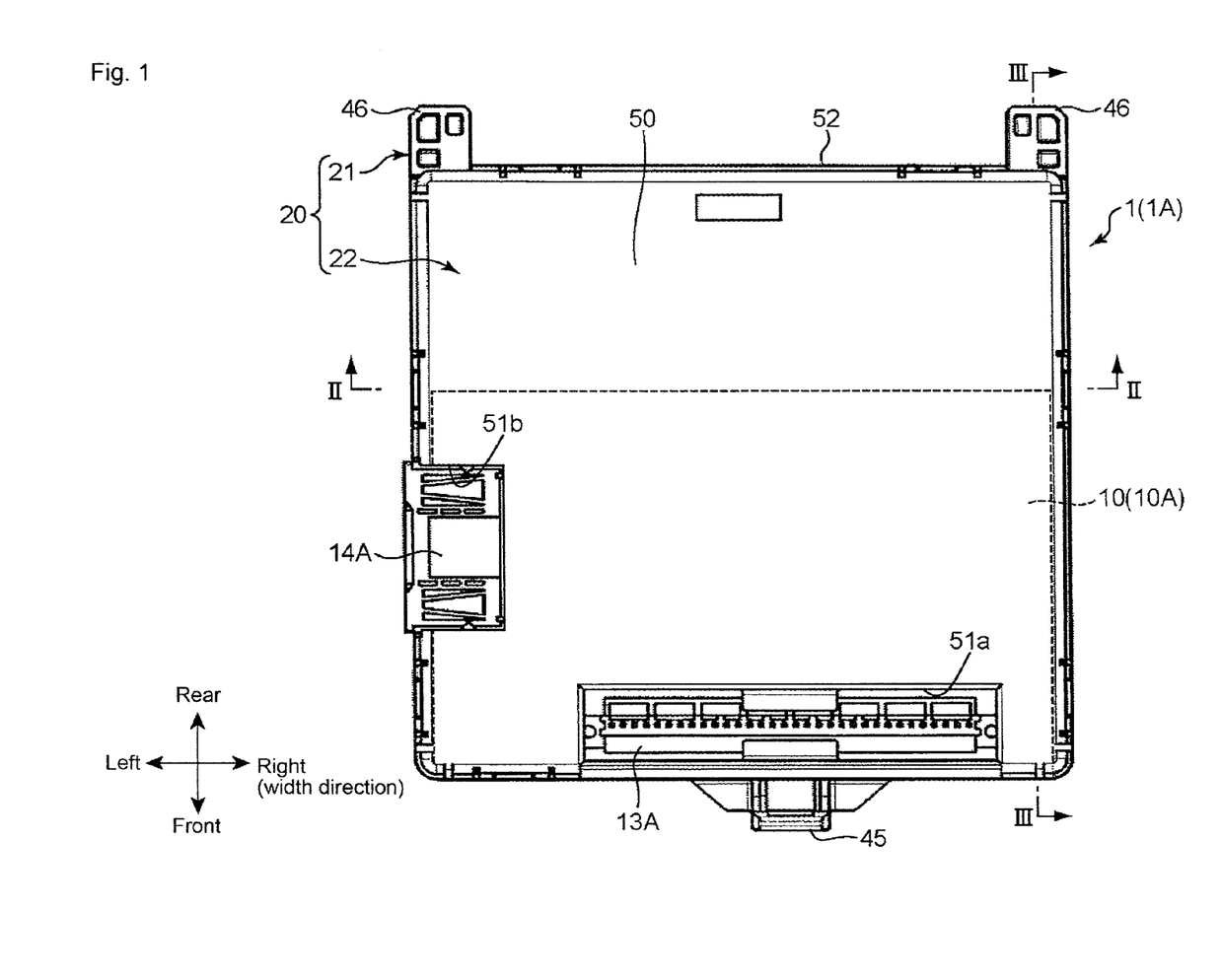
FIG. 1 is a plan view showing an electronic control unit as an electronic unit according to the present invention.
Figure 2:
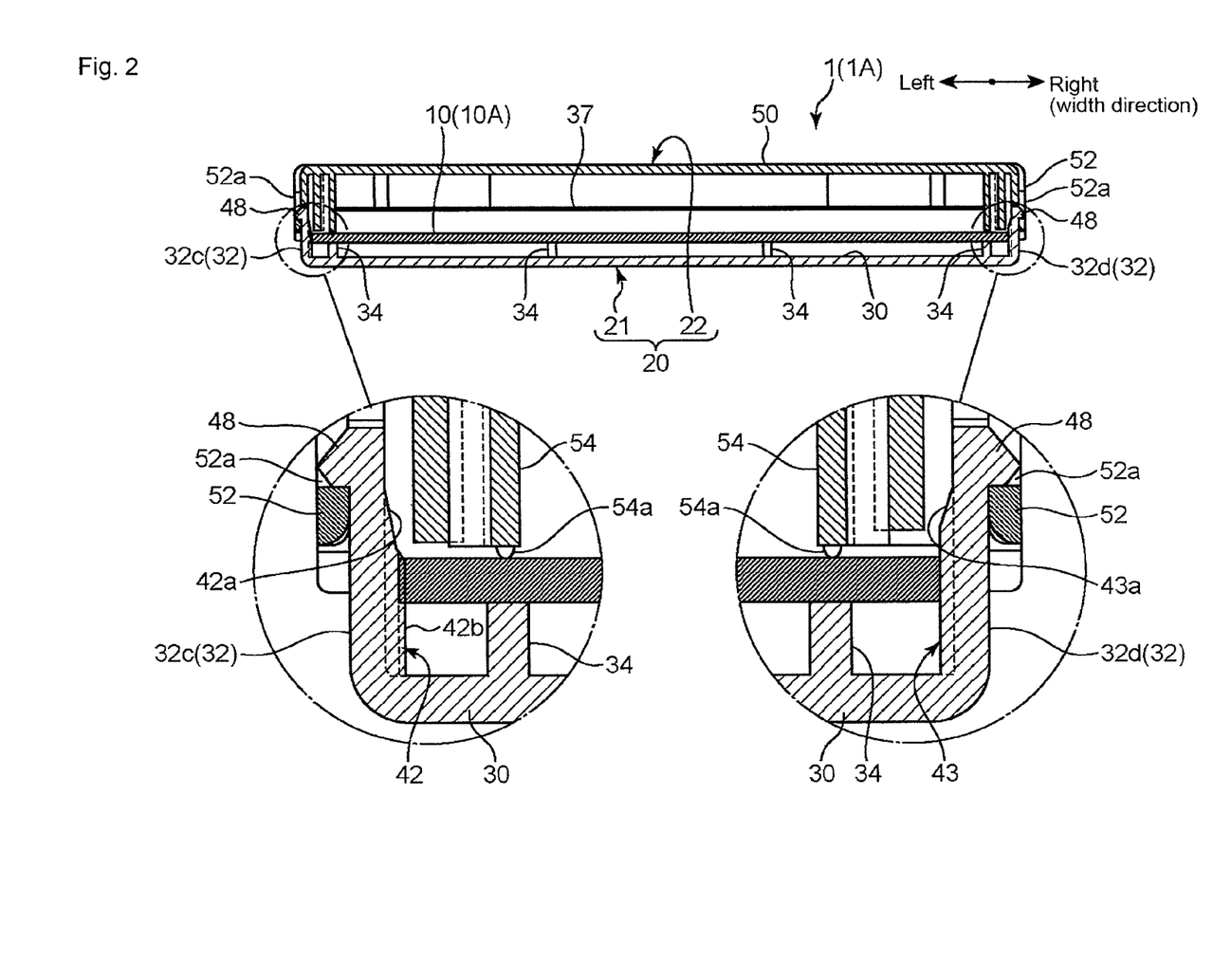
FIG. 2 is a cross-sectional view taken along the line II-II in FIG. 1 showing the electronic control unit.
Figure 3:
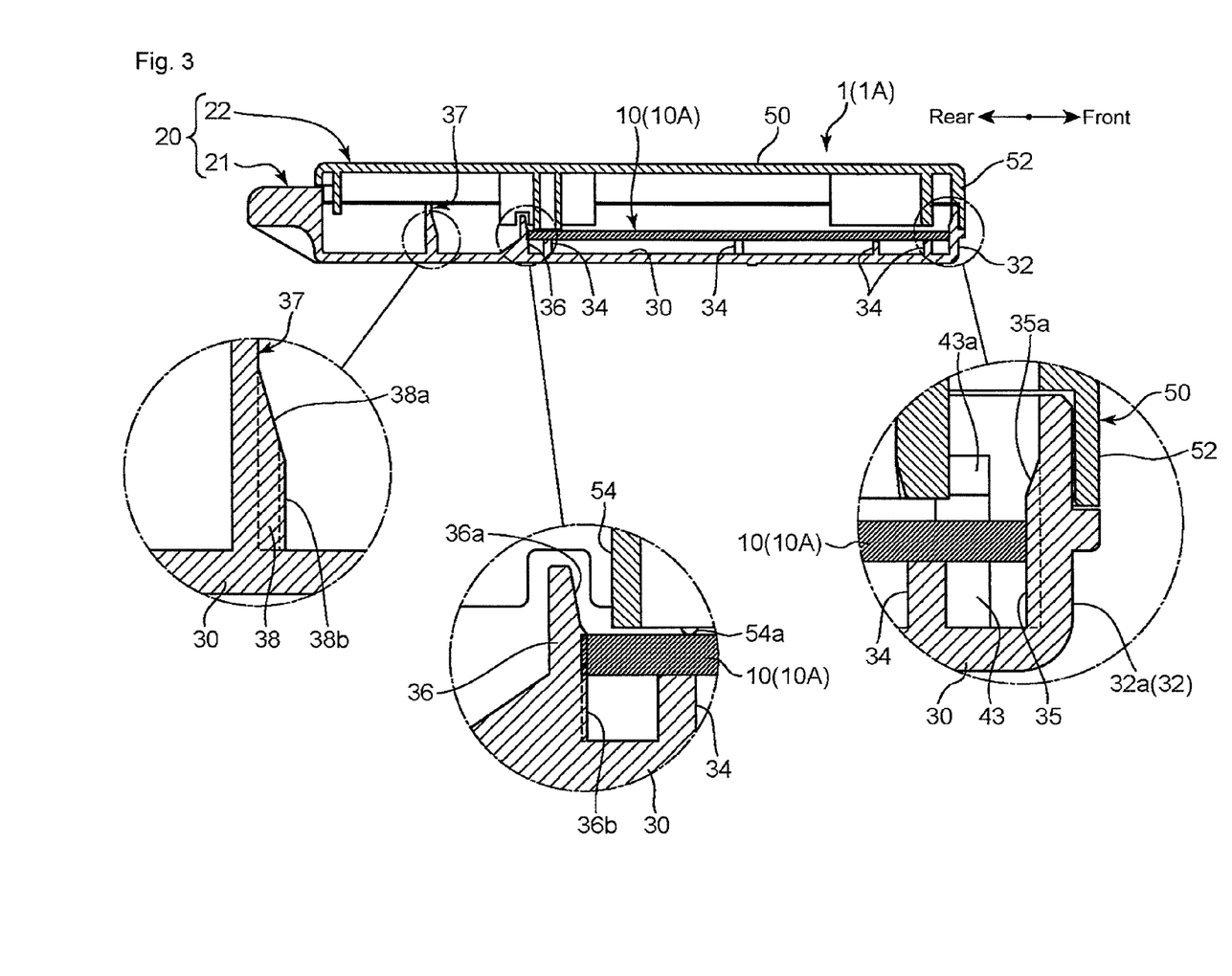
FIG. 3 is a cross-sectional view showing the electronic control unit (in which a first substrate is accommodated) (a cross-sectional view taken along the line in FIG. 1).
Figure 4:
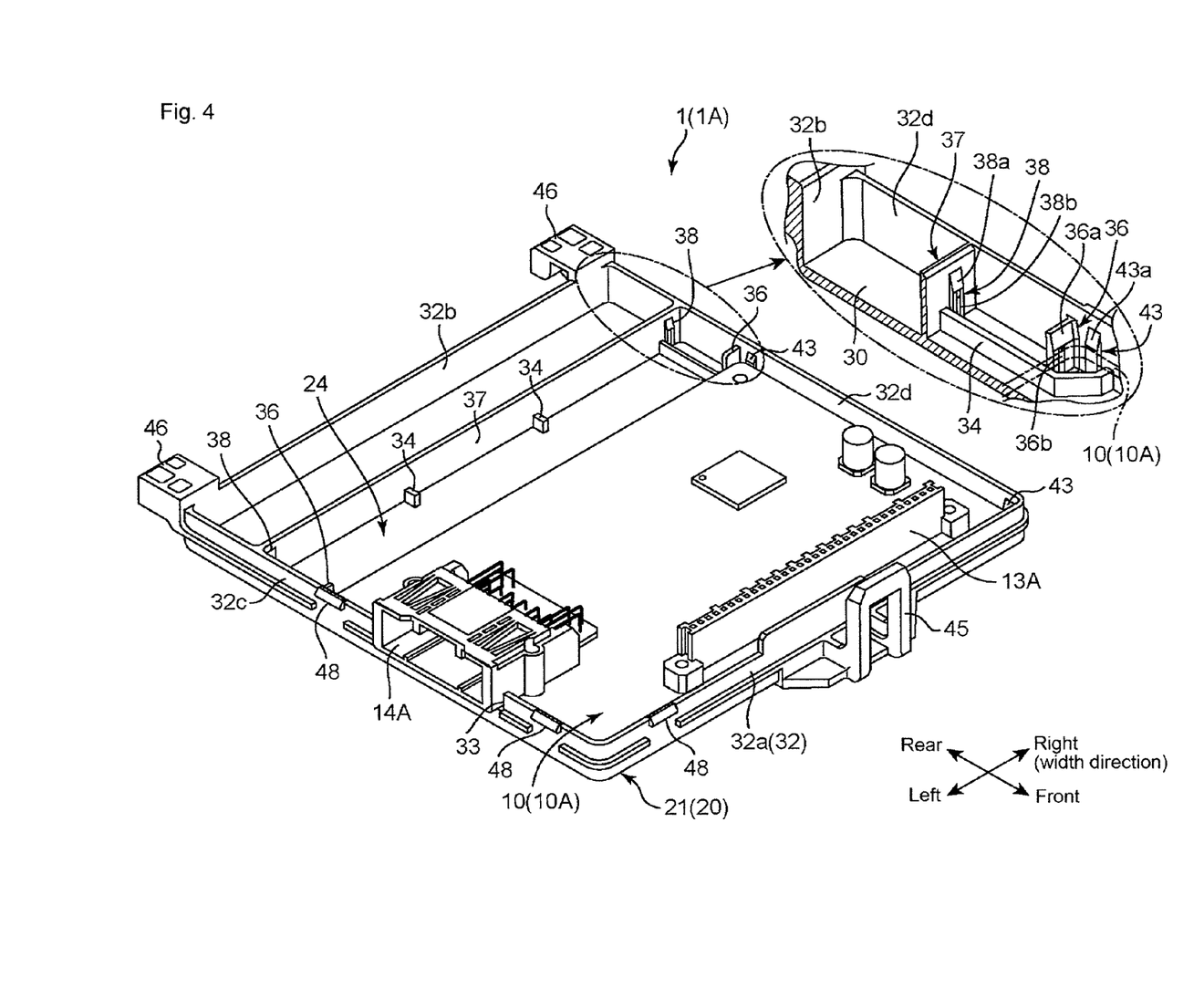
FIG. 4 is a perspective view showing the electronic control unit (in which the first substrate is accommodated) in a state in which a cover member is removed.

FIG. 1 to FIG. 4 show a vehicle-mounted electronic control unit (ECU), which is an electronic unit according to the present invention. FIG. 1 is a plan view, FIG. 2 and FIG. 3 are cross-sectional views, and FIG. 4 is a perspective view (a state in which a cover member is removed, described later), and the electronic control unit is schematically shown therein, respectively.

Figure 8:
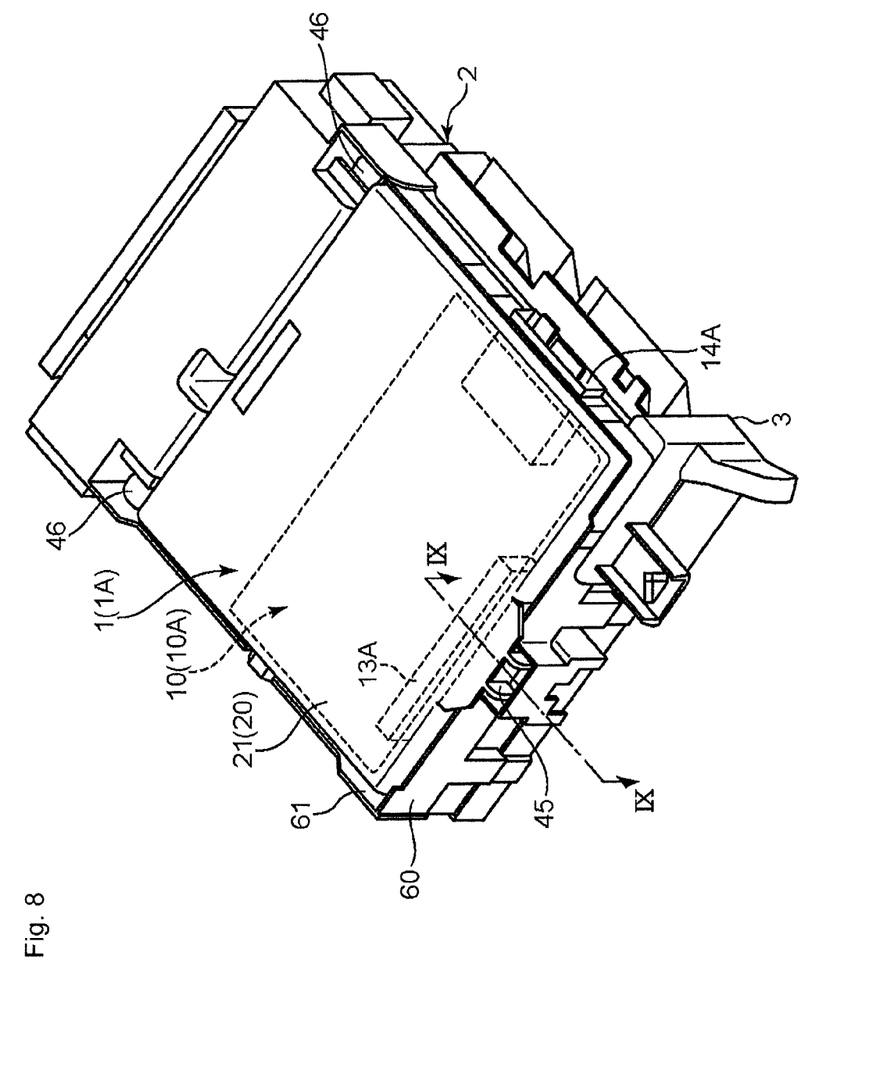
FIG. 8 is a perspective view showing a J/B (electric connection box) in a state in which the electronic control unit according to the present invention is assembled.

An electronic control unit (hereinafter, referred to as ECU) 1 is configured to control various types of electrical components to be mounted on a vehicle. The ECU 1 is assembled to a J/B (junction box; electric connection box) 2 and is assembled to the vehicle integrally with the J/B 2 as shown in FIG. 8. A structure of assembly of the ECU 1 to the J/B 2 will be described later.

The ECU 1 includes a substrate 10 provided with a circuit to be electrically connected to a circuit in the J/B 2, and a case 20 in which the substrate 10 is to be accommodated as shown in FIG. 1 to FIG. 4.

Figure 7A:
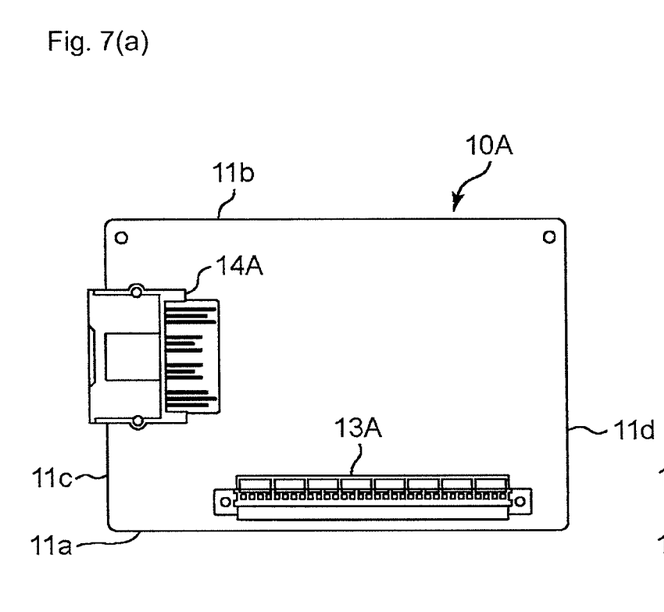

The case 20 has a shape which can selectively accommodate either a first substrate 10A or a second substrate 10B as shown in FIGS. 7(a), (b) as the substrate 10 described above. The substrates 10A, 10B are selectively used in accordance with vehicle grades and, in FIG. 1 to FIG. 4, a state in which the first substrate 10A is accommodated in the case 20 is shown. In the description given below, the case 20 with the first substrate 10A accommodated therein is referred to as a first ECU 1A, and the case 20 with the second substrate 10B accommodated therein is referred to as a second ECU 1B when specifically necessary, and if discrimination is not specifically necessary, the both are referred to simply as ECU 1.

The first substrate 10A as shown in FIG. 7(a), includes a first reference side 11a, a first opposed side 11b extending in parallel to the first reference side 11a and opposing the first reference side 11a, and a pair of first lateral sides 11c, 11d extending between the first reference side 11a and the first opposed side 11b in the direction orthogonal to the first reference side 11a and the first opposed side 11b and opposing each other and a J/B connecting connector 13A is mounted along the first reference side 11a, and a harness connecting connector 14A is mounted along the first lateral side 11c on one side.

Figure 7B:
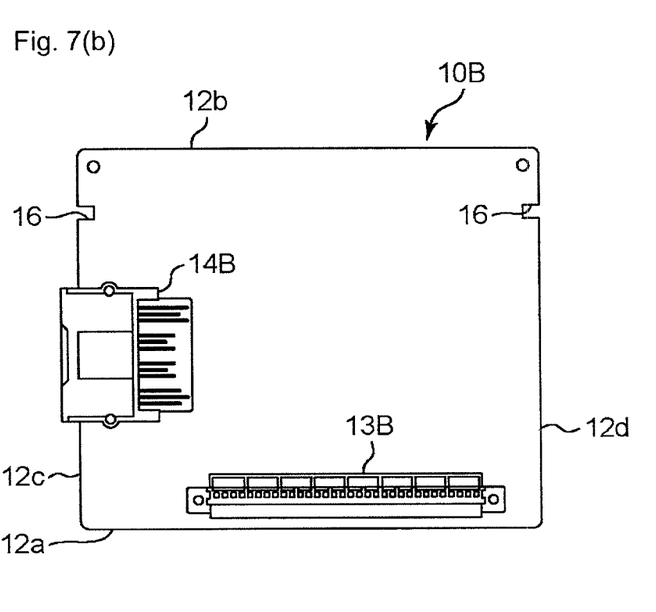

In contrast, the second substrate 10B, as shown in FIG. 7(b), includes an second reference side 12a and a second opposed side 12b corresponding to the first reference side 11a and the first opposed side 11b, and a pair of second lateral sides 12c, 12d extending between the second reference side 12a and the second opposed side 12b in the direction orthogonal to the second reference side 12a and the second opposed side 12b, opposing each other, and having a dimension larger than the first lateral sides 11c, 11d and the J/B connecting connector 13B is mounted with respect to the second reference side 12a in a relative positional relationship equivalent to the relative positional relationship between the first reference side 11a of the first substrate 10A and the J/B connecting connector 13A, and the harness connecting connector 14B is mounted with respect to the second lateral side 12c on one side in a relative positional relationship equivalent to the relative positional relationship between the first lateral side 11c on one side of the first substrate 10A and the harness connecting connector 14A.

The J/B connecting connector 13A of the first substrate 10A and the J/B connecting connector 13B of the second substrate 10B, and the harness connecting connector 14A of the first substrate 10A and the harness connecting connector 14B of the second substrate 10B are equivalent respectively except for a case where there may be a case where the number of terminals or the arrangement thereof may be different.

In the following description, the first substrate 10A and the second substrate 10B are referred to as the substrate 10 except for a case where discrimination is specifically required.

Referring back to FIG. 1 to FIG. 4, the case 20 includes a case body 21 for supporting the substrate 10, and a cover member 22 mounted on the case body 21 so as to be removable and configured to cover the substrate 10 in this mounted state from the outside. The case body 21 and the cover member 22 are resin molds, and are formed of resin materials having insulating properties. When using directions in the description below, description will be given on the basis of indications shown in FIG. 1 for the sake of convenience. In this case, the lateral direction is referred to also as the "width direction" as needed.

The case body 21 has a shape including a bottom wall portion 30 having a rectangular shape nearly a square and an outer peripheral portion 32 extending upright along an outer edge of the bottom wall portion 30, and opening on the side opposite from the bottom wall portion 30 as shown in FIG. 1 to FIG. 4. More specifically, the outer peripheral portion 32 includes a front wall portion 32a and a rear wall portion 32b extending parallel to each other in the width direction and a left wall portion 32c and a right wall portion 32d extending in parallel to each other in the fore-and-aft direction. Formed inside the outer peripheral portion 32 is a diaphragm 37 extending upright from the bottom wall portion 30, extending in parallel to the front wall portion 32a and the rear wall portion 32b, and being continued to the left wall portion 32c and a right wall portion 32d, and an inner space of the outer peripheral portion 32 is divided into the front and the rear by the diaphragm 37.

In the case body 21, an inner space surrounded by the front wall portion 32a, the left wall portion 32c, the right wall portion 32d, and the diaphragm 37 corresponds to a substrate accommodating portion 24 for accommodating the substrate 10, and the substrate accommodating portion 24 allows insertion of both of the first substrate 10A and the second substrate 10B along the direction of normal lines thereof. In this embodiment, the front wall portion 32a, the left wall portion 32c, the right wall portion 32d, and the diaphragm 37 correspond to a peripheral wall portion of the present invention.

Formed in an area of the bottom wall portion 30 corresponding to the substrate accommodating portion 24 are plural supporting portions 34 (corresponding to a substrate supporting portion of the present invention) configured to support the substrate 10 accommodated in the substrate accommodating portion 24 from the side opposite from the opening. The supporting portions 34 are formed of projections projecting from the wall surface of the bottom wall portion 30.

The left wall portion 32c and the right wall portion 32d (corresponding to a pair of side wall portions of the present invention) include widthwise holding portions 42, 43 that restrain the substrate 10 in the width direction in a state of being fixed in position by coming into abutment with the first lateral sides 11c, 11d of the first substrate 10A or the second lateral sides 12c, 12d of the second substrate 10B from the outside in the width direction. The widthwise holding portions 42, 43 are provided on opposed surfaces of the respective wall portions 32c, 32d at plural positions in the fore-and-aft direction. In this example, the widthwise holding portions 42, 43 are provided at a position in the vicinity of the front wall portion 32a, and a position apart from that position rearward. The widthwise holding portion 42 of the left wall portion 32c and the widthwise holding portion 43 of the right wall portion 32d oppose each other in the width direction of the case body 21.

The widthwise holding portions 42, 43 are formed of projecting ridges projecting toward the substrate accommodating portion 24 from the respective opposed surfaces of the left wall portion 32c and the right wall portion 32d and extending in the direction of the thickness of the case (the vertical direction in FIG. 2: hereinafter, referred to as the "vertical direction"), and has a constant width in the fore-and-aft direction.

The widthwise holding portion 43 of the right wall portion 32d among opposed surfaces of the widthwise holding portions 42, 43 is a reference surface for positioning the substrate 10 in the width direction. In contrast, the widthwise holding portion 42 of the left wall portion 32c is provided with a pressing deformable portion 42b (corresponding to a third pressing portion of the present invention) for pressing the substrate 10 toward the reference surface. The pressing deformable portion 42b is formed of a narrow projecting ridge projecting from the opposed surface of the widthwise holding portion 42 and having a cross section of a semicircular shape extending in the vertical direction. The pressing deformable portion 42b is formed to be located at a position where the distance from the widthwise holding portion 43 of the right wall portion 32d is smaller than the dimensions of the first reference side 11a (the first opposed side 11b) of the first substrate 10A and the second reference side 12a (the second opposed side 12b) of the second substrate 10B and to be capable of being resiliently deformed from this position in the direction away from the right wall portion 32d. In other words, the pressing deformable portion 42b allows the first substrate 10A or the second substrate 10B to be press-fitted into a space between the pressing deformable portion 42b and the right wall portion 32d by the resilient deformation, and is formed so as to be capable of pressing the first substrate 10A or the second substrate 10B press-fitted therein against the right wall portion 32d (the reference surface of the widthwise holding portion 43) by a resilient restoration force of the pressing deformable portion 42b.

Formed on upper end portions of the opposed surfaces of the respective widthwise holding portions 42, 43 are tapered portions 42a, 43a for guiding the substrate 10 into a space between the widthwise holding portions 42 and 43. Accordingly, when accommodating the substrate 10 into the substrate accommodating portion 24, the substrate 10 can be press-fitted smoothly into a space between the left wall portion 32c and the right wall portion 32d along the tapered portions 42a, 43a.

In contrast, as shown in FIG. 3 and FIG. 4, the front wall portion 32a (corresponding to a reference wall portion of the present invention) and the diaphragm 37 (corresponding to a second restraint portion of the present invention) are provided with the fore-and-aft direction holding portions 35, 38, respectively. The case body 21 is provided with a pair of ribs 36 (corresponding to a restraint projecting portion (a first restraint portion) of the present invention) projecting inward respectively from inner side surfaces of the left wall portion 32c and the right wall portion 32d at a position between the front wall portion 32a and the diaphragm 37. The fore-and-aft direction holding portions 35, 38 and the ribs 36 are configured to restrain the first substrate 10A and the second substrate 10B in a state of being positioned in the fore-and-aft direction.

The fore-and-aft direction holding portions 35, 38 are provided at plural positions in the width direction on opposed surfaces of the respective wall portions 32a, 37, respectively and, in this example, are provided at both end portions in the width direction. The fore-and-aft direction holding portions 35, 38 are formed of projecting ridges projecting from the respective opposed surfaces of the front wall portion 32a and the diaphragm 37 toward the substrate accommodating portion 24 and extending in the vertical direction and have a constant width.

Fore-and-aft direction holding portion 35 of the front wall portion 32a serves as a reference for positioning the substrate 10 with respect to the case body 21 in the fore-and-aft direction, and positions the substrate 10 in the fore-and-aft direction by being brought into abutment with the first reference side 11a of the first substrate 10A and the second reference side 12a of the second substrate 10B. Therefore, the surface of the fore-and-aft direction holding portion 35 (the surface opposing the diaphragm 37) is a reference surface for the positioning.

Each of the ribs 36 has a panel shape having a thickness in the fore-and-aft direction, and are continued respectively to the bottom wall portion 30. The ribs 36 are each provided with a pressing deformable portion 36b (corresponding to a first pressing portion of the present invention) on the front surface thereof. The pressing deformable portions 36b are each formed of a narrow projecting ridge projecting from the front surface of the rib 36, extending in the vertical direction, and having a semicircular shape in cross section. The pressing deformable portions 36b are each formed to be located at a position where the distance from the fore-and-aft direction holding portion 35 (the reference surface) of the front wall portion 32a is smaller than the sizes of the first lateral sides 11c, 11d of the first substrate 10A and to be capable of being resiliently deformed from this position in the direction away from the front wall portion 32a. In other words, the pressing deformable portion 36b allows the first substrate 10A to be press-fitted into a space between the pressing deformable portion 36b and the front wall portion 32a by the resilient deformation, and is formed so as to be capable of pressing the press-fitted first substrate 10A against the front wall portion 32a (the reference surface of the fore-and-aft direction holding portion 35) by a resilient restoration force of the pressing deformable portion 36b.

In contrast, the fore-and-aft direction holding portions 38 of the diaphragm 37 are each provided with a pressing deformable portion 38b (corresponding to a second pressing portion of the present invention) equivalent to the rib 36 on the front surface thereof. The pressing deformable portions 38b are each formed of a narrow projecting ridge projecting from the front surface of the fore-and-aft direction holding portion 38, extending in the vertical direction, and having a semicircular shape in cross section. The pressing deformable portions 38b are each formed to be located at a position where the distance from the fore-and-aft direction holding portion 35 (the reference surface) of the front wall portion 32a is smaller than the sizes of the second lateral sides 12c, 12d of the second substrate 10B and to be capable of being resiliently deformed to move from this position in the direction so as to be displaced away from the front wall portion 32a, and allows the second substrate 10B to be press-fitted into a space between the pressing deformable portion 38b and the front wall portion 32a by the resilient deformation and is formed so as to be capable of pressing the press-fitted second substrate 10B against the front wall portion 32a (the reference surface of the fore-and-aft direction holding portion 35) by a resilient restoration force of the pressing deformable portion 38b.

Upper end portions of opposed surfaces of the fore-and-aft direction holding portion 35 of the front wall portion 32a and the ribs 36 and upper end portions of the front surfaces of the fore-and-aft direction holding portions 38 of the diaphragm 37 are formed with tapered portions 35a, 36a, and 38a, respectively. Therefore, when accommodating the substrate 10 into the substrate accommodating portion 24, the first substrate 10A can be press-fitted smoothly into a space between the front wall portion 32a and the ribs 36 along the tapered portions 35a, 36a, and the second substrate 10B can be press-fitted smoothly into a space between the front wall portions 32a and 37 along the tapered portions 35a, 38a.

As shown in FIG. 1 and FIG. 4, the case body 21 is provided further with locking portions 45, 46 for locking the ECU 1 with the J/B 2. The locking portions 45, 46 are integrally formed on the front wall portion 32a and the rear wall portion 32b. The left wall portion 32c is formed with notches 33 for exposing the harness connecting connectors 14A, 14B, described later, of the respective substrates 10A, 10B to the outside.

The cover member 22 includes a top panel portion 50 having a substantially square shape corresponding to the bottom wall portion 30 of the case body 21, and a side wall portion 52 extending downward along an outer edge thereof as shown in FIG. 1 to FIG. 4.

The side wall portion 52 is formed so as to fit on the outer peripheral portion 32 of the case body 21, and is provided with locking windows 52a with respect to the case body 21 at plural positions in the circumferential direction. In other words, the cover member 22 is covered on the case body 21 so as to close the opening of the case body 21 by the top panel portion 50, and is mounted on the case body 21 by the side wall portion 52 being fitted on the outer peripheral portion 32 of the case body 21 as shown in FIG. 2 and FIG. 3. Then, in this mounted state, hook portions 48 formed on the outer peripheral portion 32 of the case body 21 are inserted into the locking windows 52a of the cover member 22, whereby the cover member 22 is locked with respect to the case body 21.

The top panel portion 50 includes plural press-down portions 54 for pressing the substrate 10 accommodated in the substrate accommodating portion 24 downward. The press-down portions 54 extend downward from a lower surface of the top panel portion 50 and are provided at distal ends (lower ends) thereof with, for example, semicircular-shaped projections 54a. The press-down portions 54 are provided on the lower surface of the top panel portion 50 at a position rather front side of the respective ribs 36 of the case body 21, and at a position opposing rather rear side of the fore-and-aft direction holding portion 35 of the front wall portion 32a. More specifically, they are provided at positions opposing the supporting portions 34 of the case body 21. Therefore, when the cover member 22 is mounted on the case body 21, the press-down portions 54 (the projections 54a) press the substrate 10 against the supporting portions 34 at the positions opposing the supporting portions 34, whereby the substrate 10 is clamped in the direction of the thickness thereof by the press-down portions 54 and the supporting portions 34.

Reference numeral 51a in FIG. 1 designates an opening formed on the top panel portion 50 so as to expose the J/B connecting connectors 13A, 13B, described later, to be mounted on the respective substrates 10A, 10B to the outside, and reference numeral 51b designates an interference preventing notch formed on the top panel portion 50 to release the harness connecting connectors 14A, 14B, described later, to be mounted on the respective substrates 10A, 10B.

Assembly of the ECU 1 is performed by preparing the case 20 and the substrate 10 described above, accommodating the substrate 10 in the substrate accommodating portion 24 of the case body 21, and then mounting the cover member 22 on the case body 21. Description thereof will be given below in detail together with a method of manufacturing the ECU 1.

Manufacture of the ECU 1 is achieved via a case manufacturing step for manufacturing the above-described case 20, a substrate manufacturing step for manufacturing the substrate 10, and an assembling step for accommodating the substrate 10 in the case body 21 and assembling the ECU 1.

In the substrate manufacturing step, the first substrate 10A and the second substrate 10B are manufactured (corresponding to a first substrate manufacturing step and a second substrate manufacturing step of the present invention).

The first substrate 10A includes as described above (see FIG. 7), the first reference side 11a, the first opposed side 11b opposing the first reference side 11a, and the pair of the first lateral sides 11c, 11d and includes the J/B connecting connector 13A and the harness connecting connector 14A mounted thereon (FIG. 7(a)). Also, the second substrate 10B includes the second reference side 12a and the second opposed side 12b equivalent to the first reference side 11a and the first opposed side 11b, and the pair of the second lateral sides 12c, 12d having the larger dimension than the first lateral sides 11c, 11d of the first substrate 10A, and includes the J/B connecting connector 13B and the harness connecting connector 14B mounted thereon.

The second substrate 10B is provided with notches 16 at both end portions respectively in the direction parallel to the second reference side 12a in the vicinity of the second opposed side 12b as shown in FIG. 7B. The notches 16 are formed for releasing the ribs 36 when accommodating into the case body 21, and hence the notches 16 have a shape which can avoid interference with the ribs 36.

The J/B connecting connectors 13A, 13B are each a female-type connector including plural female terminals accommodated in a row in a connector housing. The J/B connecting connectors 13A, 13B are fixed so as to be oriented upward, that is, in postures which allow the connectors on the opposite side to be connected along the directions of the normal lines of the substrates 10A, 10B. In contrast, the harness connecting connectors 14A, 14B are each a male-type connector provided with plural male-type terminals in a connector housing. The harness connecting connectors 14A, 14B are fixed in a posture oriented sideward (leftward in FIG. 7), that is, in postures which allow the connectors on the opposite side to be connected from the side along the surfaces of the substrates 10A, 10B.

In the assembly step for the ECU 1, assembly of a first ECU (a first electronic unit of the present invention) including the first substrate 10A accommodated in the case 20 and a second ECU (a second electronic unit of the present invention) including the second substrate 10B accommodated in the case 20.

The assembly of the first ECU 1A (corresponding to a first unit assembling step of the present invention) is performed by press-fitting the first substrate 10A into the inside of the front wall portion 32a, the left wall portion 32c, the right wall portion 32d, and the ribs 36 of the case body 21 while pressing the first reference side 11a against the front wall portion 32a as shown in FIG. 2 to FIG. 4. In this configuration, the first substrate 10A is restrained in the fore-and-aft direction by the front wall portion 32a and the ribs 36 coming into abutment with the first reference side 11a and the first opposed side 11b of the first substrate 10A, respectively. Also, the first substrate 10A is restrained in the width direction by the left wall portion 32c and the right wall portion 32d coming into abutment with the first lateral sides 11c, 11d of the first substrate 10A respectively. Then, in association with the press-fitting of the first substrate 10A, the pressing deformable portions 36b of the ribs 36 are resiliently deformed, and the first substrate 10A is pressed by the fore-and-aft direction holding portion 35 of the front wall portion 32a by the resilient restoration force, so that the first substrate 10A is positioned in the fore-and-aft direction with reference to the front wall portion 32a. Also, the pressing deformable portion 42b formed on the widthwise holding portion 42 of the left wall portion 32c is resiliently deformed, and the first substrate 10A is pressed by the widthwise holding portion 43 of the right wall portion 32d by the resilient restoration force, so that the first substrate 10A is positioned in the lateral direction with reference to the right wall portion 32d.

It this manner, after the first substrate 10A has accommodated in the case body 21, the cover member 22 is mounted on the case body 21, whereby the assembly of the first ECU 1A is completed. More specifically, the J/B connecting connector 13A is exposed from the opening 51a to the outside, the cover member 22 is covered on the case body 21 with the harness connecting connector 14A interposed in the notch 51b, and the cover member 22 is locked with the hook portions 48 of the case body 21.

Figure 5:
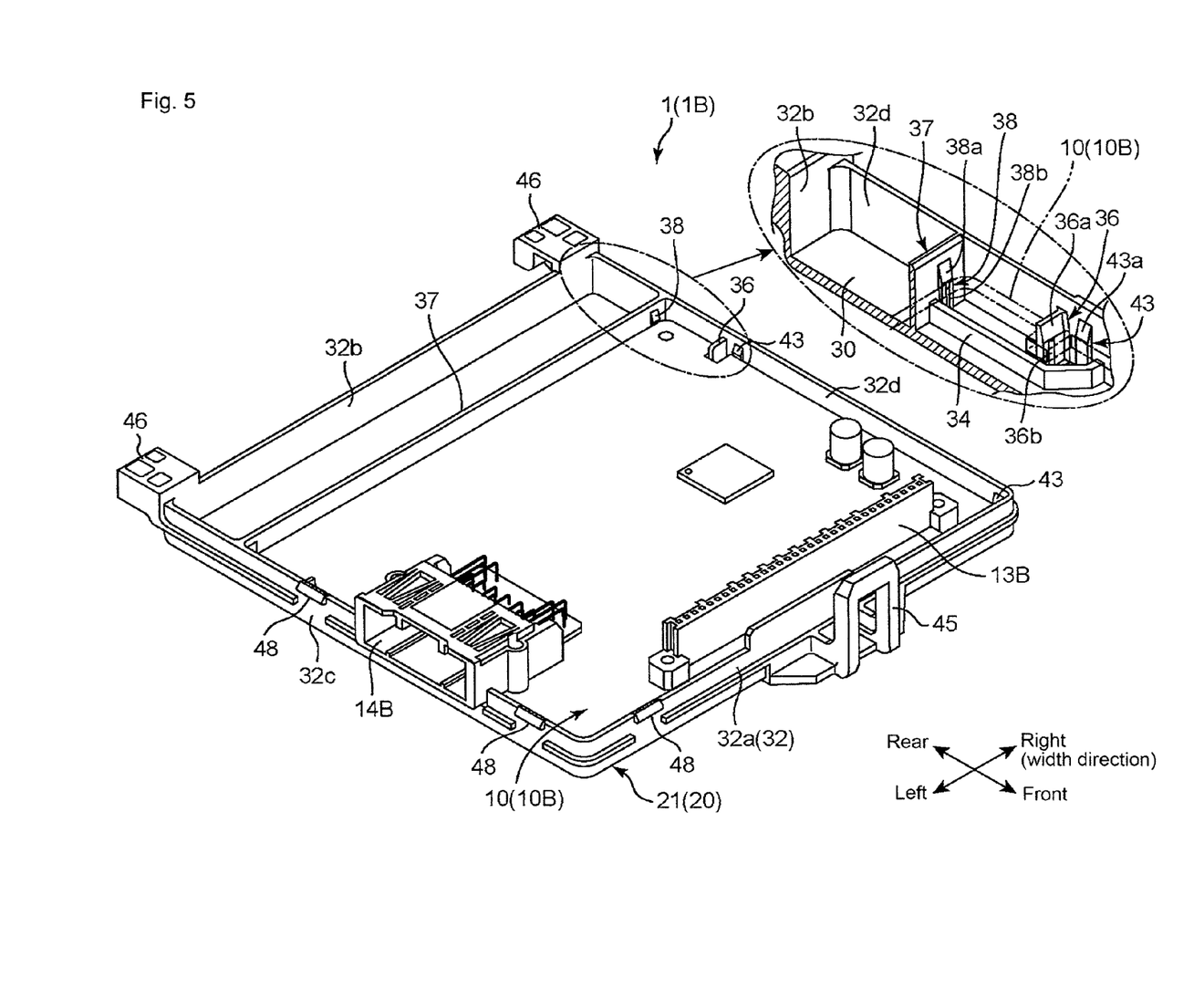
FIG. 5 is a perspective view showing the electronic control unit (in which the second substrate is accommodated) in a state in which the cover member is removed.
Figure 6:
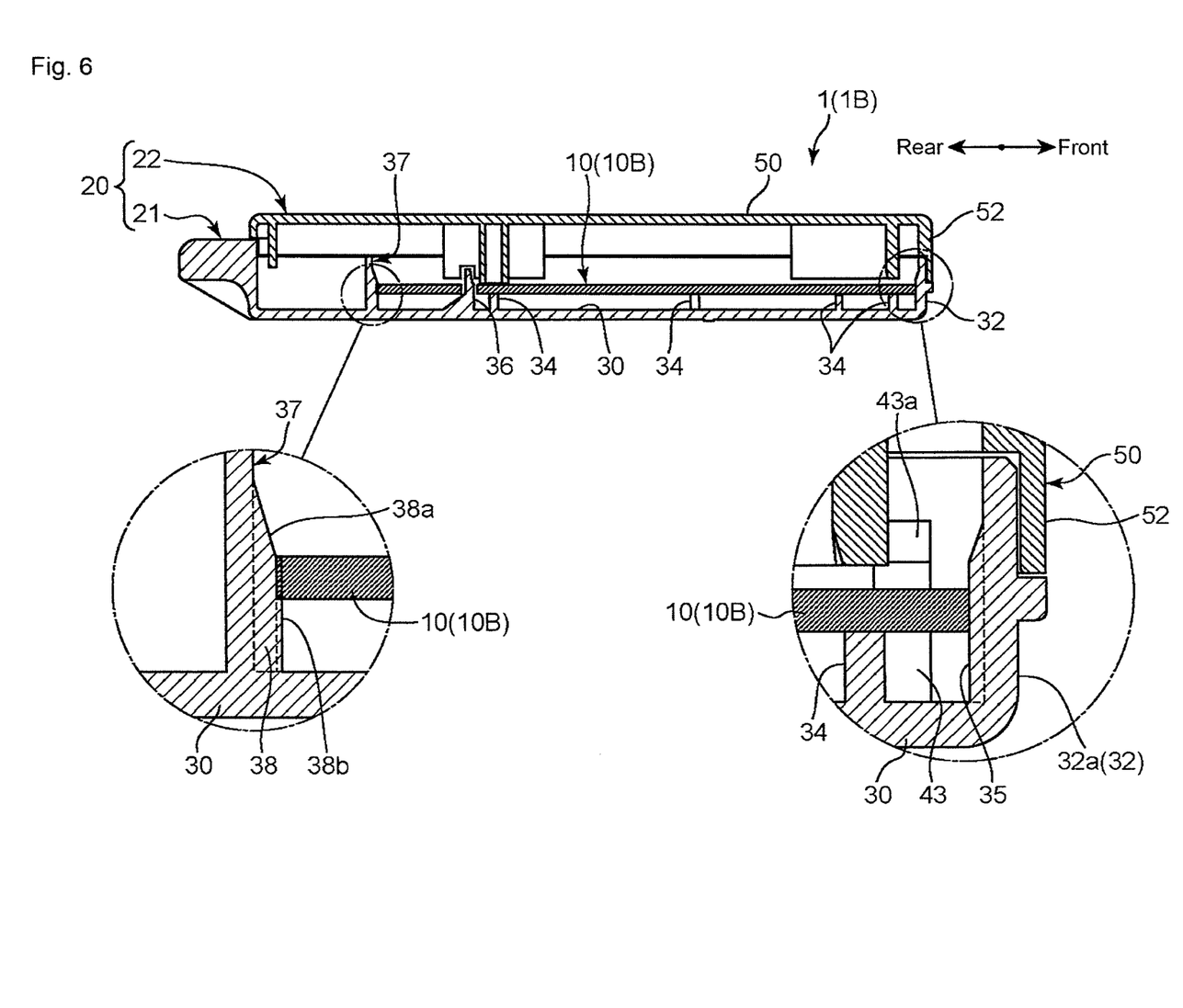
FIG. 6 is a cross-sectional view showing the electronic control unit (in which a second substrate is accommodated) (corresponding to a cross-sectional view taken along the line in FIG. 1).

In contrast, the assembly of the second ECU 1B (corresponding to a second unit assembling step of the present invention) is performed by press-fitting the second substrate 10B into the inside of the front wall portion 32a, the left wall portion 32c, the right wall portion 32d, and the diaphragm 37 of the case body 21 while pressing the second reference side 12a against the front wall portion 32a as shown in FIG. 5 and FIG. 6. In this configuration, the second substrate 10B is restrained in the fore-and-aft direction by the front wall portion 32a and the diaphragm 37 coming into abutment with the second reference side 12a and the second opposed side 12b of the second substrate 10B respectively. Also, the second substrate 10B is restrained in the width direction by the left wall portion 32c and the right wall portion 32d coming into abutment with the second lateral sides 12c, 12d of the second substrate 10B respectively. Then, in association with the press-fitting of the second substrate 10B, the pressing deformable portions 38b formed on the fore-and-aft direction holding portions 38 of the diaphragm 37 are resiliently deformed, and the second substrate 10B is pressed by the fore-and-aft direction holding portion 35 of the front wall portion 32a by the resilient restoration force, so that the second substrate 10B is positioned in the fore-and-aft direction with reference to the front wall portion 32a. Also, the pressing deformable portion 42b formed on the widthwise holding portion 42 of the left wall portion 32c is resiliently deformed, and the second substrate 10B is pressed by the widthwise holding portion 43 of the right wall portion 32*d* by the resilient restoration force, so that the second substrate 10B is positioned in the lateral direction with reference to the right wall portion 32*d*.

When the second substrate 10B is accommodated in the case body 21, as shown in the same drawing, the ribs 36 are interposed in the notches 16 formed on the second substrate 10B, whereby the second substrate 10B is accommodated in the substrate accommodating portion 24 without being interfered with the ribs 36. Therefore, even though the ribs 36 are provided between the front wall portion 32*a* and the diaphragm 37, the second substrate 10B can be accommodated in the case body 21 without problem.

It this manner, after the second substrate 10B has accommodated in the case body 21, the cover member 22 is mounted on the case body 21, whereby the assembly of the second ECU 1B is completed. In this case as well, in the same manner as the first ECU 1A, the J/B connecting connector 13B is exposed from the opening 51*a* to the outside, the cover member 22 is covered on the case body 21 with the harness connecting connector 14B interposed in the notch 51*b*, and the cover member 22 is locked with the hook portions 48 of the case body 21.

The ECUs 1A, 1B as described above are mounted on the vehicle integrally with the J/B 2 in a state of being assembled to the J/B 2. Here, the assembly of the first ECU 1A to the J/B 2 will be described in brief using FIG. 8 and FIG. 9.

Figure 9:
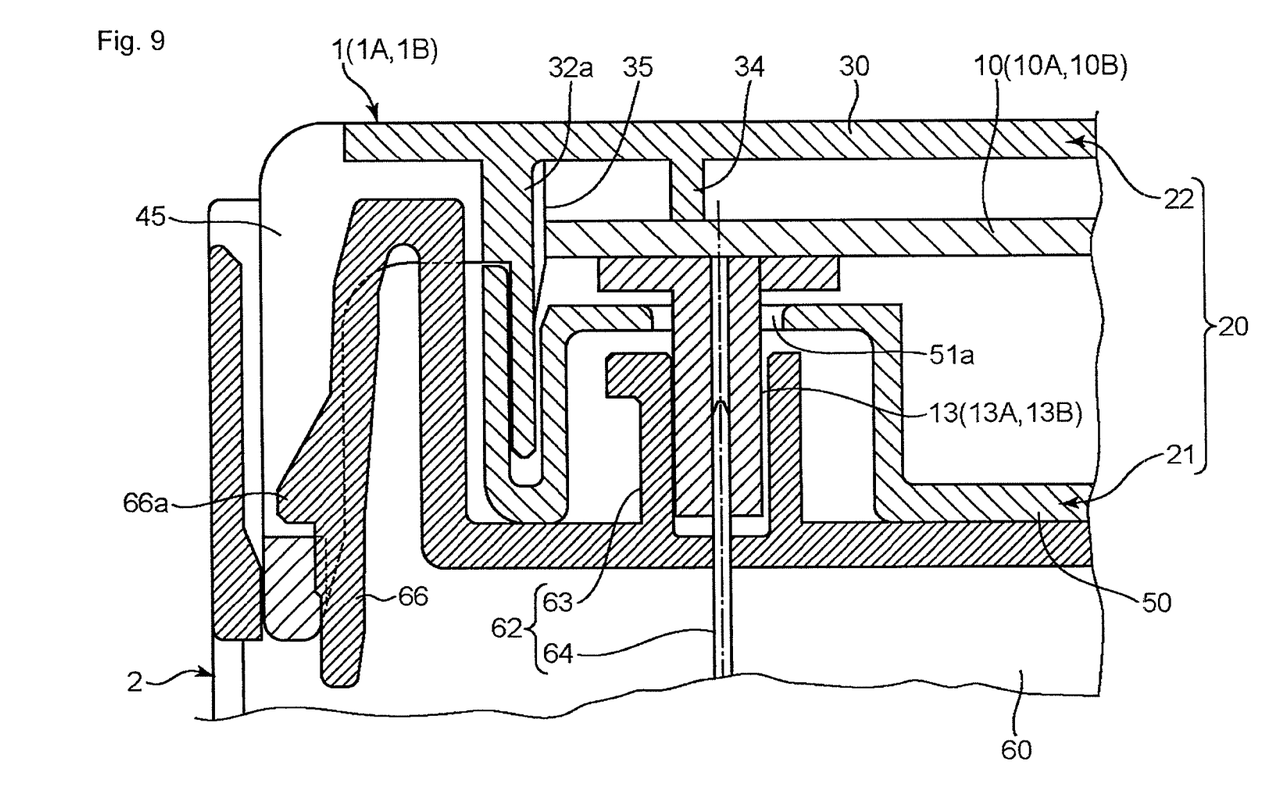
FIG. 9 is a cross-sectional view (taken along the line IX-IX in FIG. 8) of a principal portion of the J/B.

As shown in the same drawing, the J/B 2 includes a housing 60 having an assembly depression 61 for the ECUs 1A, 1B. The assembly depression 61 is provided with an ECU connecting connector 62 on an inner bottom portion thereof, and the ECU connecting connector 62 includes a cylindrical connector fitting portion 63 formed integrally with the housing 60 and a pin terminal 64 held by the housing 60 in a state of being projecting inward. The ECU connecting connector 62 can connect the J/B connecting connectors 13A, 13B of both of the ECUs 1A and 1B. Also, the housing 60 is provided with a locking strip 66 for locking the ECUs 1A, 1B.

The assembly of the first ECU 1A to the J/B 2 is achieved by causing the first ECU 1A to face the J/B 2 so that the J/B connecting connector 13A and the ECU connecting connector 62 oppose each other and, in this state, fitting the first ECU 1A into the assembly depression 61 of the J/B 2. Accordingly, the connector housing of the J/B connecting connector 13A is fitted to the connector fitting portion 63 of the ECU connecting connector 62, and the pin terminal 64 of the ECU connecting connector 62 is inserted into the connector housing of the J/B connecting connector 13A, whereby the pin terminal 64 comes into contact with a terminal of the J/B connecting connector 13A. Accordingly, the J/B connecting connector 13A and the ECU connecting connector 62 are connected to each other, and the first ECU 1A and the J/B 2 are electrically connected. Also, the first ECU 1A is locked by the J/B 2 by the engagement of the locking strips 66 of the J/B 2 with the locking portion 45 of the first ECU 1A, whereby the first ECU 1A and the J/B 2 are locked in a state of being electrically connected.

For reference sake, although the assembly of the first ECU 1A to the J/B 2 has been described here, the assembly of the second ECU 1B to the J/B 2 can be performed in the same manner.

According to the method of manufacturing the case 20 and the ECUs 1A, 1B using the case 20 of the present invention described above, the ECUs 1A, 1B in which the first substrate 10A or the second substrate 10B having different sizes (surface areas) is accommodated can be manufactured efficiently using the common cases 20. Therefore, the manufacture and management of the specific cases for the respective vehicle grades are not necessary as in the related art and, consequently, contribution to reduction of costs of the ECUs 1A, 1B, alleviation of a burden of component management, improvement of assemblability and the like is achieved.

In particular, the ECUs 1A, 1B are configured to cause the J/B connecting connectors 13A, 13B to be connected to the common ECU connecting connector 62 on the side of the J/B 2 by being assembled to the J/B 2 as described above, and hence the relative positional relationship between the case 20 and the J/B connecting connectors 13A, 13B is important. In this point, the case 20 is capable of accommodating the substrates 10A or 10B in the state of being positioned with reference to the front wall portion 32*a* and the right wall portion 32*d* irrespective of whether the substrates 10A or 10B is accommodated in the case 20 as described above. Therefore, the relative positional relationship between the case 20 and the J/B connecting connectors 13A,13B can be maintained constantly irrespective of whether the first substrate 10A or the second substrate 10B is accommodated. Therefore, the ECUs 1A, 1B which can be assembled to the J/B 2 adequately can be provided.

The case 20 and the method of manufacturing the ECUs 1A, 1B using the case 20 described thus far are preferable example of an electronic unit case and the method of manufacturing the electronic unit using the case according to the present invention, and the specific structure of the case 20 and the detailed method of manufacturing the ECUs 1A, 1B can be modified as needed without departing the scope of the present invention.

For example, in the embodiment described above, the case body 21 includes the pair of the ribs 36 projecting inward respectively from the inner side surfaces of the left wall portion 32*c* and the right wall portion 32*d*, and the first substrate 10A is restrained between the ribs 36 and the front wall portion 32*a*. However, it is also possible to form a single rib at an intermediate position between the left wall portion 32*c* and the right wall portion 32*d* instead of the ribs 36 and to hold the first substrate 10A by the rib and the front wall portion 32*a*. In this case, the second substrate 10B having an opening which allows the rib to interpose instead of the notches 16 may be employed. In brief, the restraint portion for restraint the first substrate 10A in cooperation with the front wall portion 32*a* (the first restraint portion) only has to have a discontinuous shape between the left wall portion 32*c* and the right wall portion 32*d*, that is, a shape which allows the second substrate 10B to continue in the fore-and-aft direction in an area where the restraint portion does not exist. However, as in the embodiment, with the pair of the ribs 36 projecting inward respectively from the inner side surfaces of the left wall portion 32*c* and the right wall portion 32*d*, accommodation of the second substrate 10B into the case body 21 is enabled only by forming notches at both ends (the both ends in the direction parallel to the second reference side). Therefore, this configuration has an advantage that the second substrate 10B can be accommodated in the case body 21 without being formed into a shape which remarkably impairs the strength thereof.

Also, in the embodiment described above, the ribs 36, the fore-and-aft direction holding portion 38, and the widthwise holding portion 42 are provided with the pressing deformable portions 36*b*, 38*b*, and 42*b*, respectively in order to position the substrate 10 (the first substrate 10A and the second substrate 10B) with reference to the front wall portion 32*a* and the right wall portion 32*d*. However, when the accuracy of the positioning doesn't require strict positioning, a configuration in which these pressing deformable portions 36*b*, 38*b*, and 42*b* are omitted may be employed.

The present invention described thus far can be summarized as follows.

In other words, an electronic unit case according to a first aspect of the present invention is an electronic unit case which constitutes an electronic unit together with a first substrate and a second substrate and has a shape allowing selective accommodation of either one of the first substrate and the second substrate, the first substrate having a first reference side, a first opposed side parallel to the first reference side and opposing the first reference side, and a pair of first lateral sides extending between the first reference side and the first opposed side in the direction orthogonal to the first reference side and the first opposed side and opposing each other, and allowing mounting of a first connector for the external connection along the first reference side, and the second substrate having a second reference side and a second opposed side equivalent to the first reference side and the first opposed side, and a pair of second lateral sides extending between the second reference side and the second opposed side in the direction orthogonal to the second reference side and the second opposed side, opposing each other, and having a dimension larger than that of the first lateral side, and allowing mounting of a second connector for the external connection in a relative positional relationship with respect to the second reference side equivalent to the relative positional relationship between the first reference side and the first connector, including: a case body opening in the direction parallel to the direction of normal lines of the first substrate and the second substrate, and has a shape which can restrain both of the first substrate and the second substrate in the direction orthogonal to the direction of the normal lines; a cover member to be mounted on the case body so as to close the opening, wherein the case body includes: a bottom wall portion having a surface area which can selectively accommodate the first substrate and the second substrate, and including a substrate supporting portion configured to support the accommodated substrate from the side opposite from the opening; and a peripheral wall portion extending upright from the bottom wall portion and having a shape which can surround both of the first substrate and the second substrate; the peripheral wall portion includes: a reference wall portion configured to come into abutment with the first reference side or the second reference side from the outside for positioning the same; a pair of side wall portions configured to come into abutment with the first lateral side or the second lateral side from the outside for positioning the same; a first restraint portion configured to restrain the first substrate in cooperation with the first reference wall portion by coming into abutment with the first opposed side of the first substrate from the outside at a position where the reference side of the first substrate comes into abutment with the reference wall portion; and a second restraint portion located at a position farther from the reference wall portion than the first restraint portion and configured to restrain the second substrate in cooperation with the reference wall portion by coming into abutment with the second opposed side of the second substrate from the outside at a position where the second reference side of the second substrate comes into abutment with the reference wall portion, and the first restraint portion has a discontinuous shape between the both side wall portions and a shape allowing the second substrate to continue in the direction parallel to the second lateral side in an area where the first restraint portion is not present.

According to the electronic unit case as described above, the electronic units in which the substrates (the first substrate, the second substrate) having different sizes (surface areas) are accommodated can be produced efficiently using the common electronic unit cases. Therefore, contribution to reduction of cost of the electronic unit such as the vehicle-mounted electronic control unit (ECU), alleviation of a burden of component management, and improvement of assemblability is achieved through utilization of the common electronic unit cases.

For reference sake, in the electronic unit case described above, it is preferable that the first restraint portion includes a pair of restraint projecting portions projecting inward respectively from the inner side surfaces of the both side wall portions, and the restraint projecting portions have a shape coming into abutment respectively with both end portions of the first opposed side of the first substrate, thereby restraining the first substrate in cooperation with the reference wall portion, and allowing the second substrate to continue in the direction parallel to the second lateral side in an area between the both restraint projecting portions.

In other words, when accommodating the second substrate in the case body, it is required to form the notches or the opening for avoiding interference with the first restraint portions on the second substrate as described above. However, when the first restraint portion has the pair of the restraint projecting portions projecting inward respectively from the inner side surfaces of the both side wall portions as described above, the second substrate only has to have the shapes at both ends thereof (both ends in the direction parallel to the second reference side) which avoid interference with the restraint projecting portions, that is, shapes having notches, so that the second substrate can be accommodated in the case body irrespective of the presence of the first restraint portion.

Also, in the electronic unit case described above, it is preferable that the first restraint portion includes a first pressing portion located at a position where the distance from the reference wall portion is smaller than the dimension of the first lateral side and capable of being resiliently deformed so as to be displaced from this position in the direction away from the reference wall portion, and the first pressing portion allows the first substrate to be press-fitted into a space between the first pressing portion and the reference wall portion by the resilient deformation and presses the press-fitted substrate against the reference wall portion by a resilient restoration force of the first pressing portion.

In this configuration, when accommodating the first substrate in the case body, the first substrate can be accommodated in the case body in a state in which the first reference side is reliably in abutment with the reference wall portion.

In the same manner, it is preferable that the second restraint portion includes a second pressing portion located at a position where the distance from the reference wall portion is smaller than the dimension of the second lateral side and capable of being resiliently deformed so as to be displaced from this position in the direction away from the reference wall portion, and the second pressing portion allows the second substrate to be press-fitted into a space between the second pressing portion and the reference wall portion by the resilient deformation and presses the press-fitted second substrate against the reference wall portion by a resilient restoration force of the second pressing portion.

In this configuration, when accommodating the second substrate in the case body, the second substrate can be accommodated in the case body in a state in which the second reference side is reliably in abutment with the reference wall portion.

In the electronic unit case described above, it is preferable that one of the pair of the side wall portions includes a third pressing portion located at a position where the distance from the other side wall portion is smaller than the dimensions of the first reference side and the second reference side and capable of being resiliently deformed so as to be displaced from this position in the direction away from the other side wall portion, and the third pressing portion allows the first substrate or the second substrate to be press-fitted into a space between the third pressing portion and the other side wall portion by the resilient deformation and presses the press-fitted first or second substrate against the other side wall portion by a resilient restoration force of the third pressing portion.

In this configuration, the first substrate and the second substrate can be accommodated in the case body in a state in which the first substrate and the second substrate are positioned with reference to one of the pair of the side wall portions.

In the electronic unit case described above, it is preferable that the cover member is provided with a press-down portion configured to press down the substrate toward the substrate supporting portion at a position opposing the substrate supporting portion.

In this configuration, since the accommodated substrate is accommodated in a state of being clamped by the press-down portion and the substrate supporting portion in the thickness direction, the substrate can be accommodated stably.

Also, a method of manufacturing an electronic unit according to an aspect of the present invention is a method of manufacturing a first electronic unit and a second electronic unit, including: a case manufacturing step for manufacturing the electronic unit case according to any one of claims 1 to 6; a first substrate manufacturing step for manufacturing the first substrate having a first reference side, a first opposed side parallel to the first reference side and opposing the first reference side, and a pair of first lateral sides extending between the first reference side and the first opposed side in the direction orthogonal to the first reference side and the first opposed side and opposing each other, and allowing mounting of a first connector for the external connection along the first reference side, the first substrate including the first reference side and the first opposed side having a dimension which allows press-fitting into a space between a pair of side wall portions of the case body of the electronic unit case, and the pair of first sides have a dimension which allows press-fitting into a space between the reference wall portion and the first restraint portion of the case member; a second substrate manufacturing step for manufacturing the second substrate having a second reference side and a second opposed side equivalent to the first reference side and the first opposed side, and a pair of second lateral sides extending between the second reference side and the second opposed side in the direction orthogonal to the second reference side and the second opposed side, opposing each other, and having a dimension which can be press-fitted into a space between the reference wall portion and the second restraint portion of the case body of the electronic unit case, allowing a second connector for the external connection in a relative positional relationship with respect to the second reference side equivalent to the relative positional relationship between the first reference side and the first connector, the second substrate being formed with a notch or an opening which is capable of avoiding interference with the first restraint portion of the case body; a first unit assembling step for assembling the first electronic unit in which the first substrate is accommodated by press-fitting the first substrate inside the reference wall portion, the first restraint portion, and the pair of the side wall portions in a state in which the first reference side is in abutment with the reference wall portion, and mounting the cover member on the case body; and a second unit assembling step for assembling the second electronic unit in which the second substrate is accommodated by press-fitting the second substrate inside the reference wall portion, the second restraint portion and the pair of the side wall portions in a state in which the second reference side is in abutment with the reference wall portion, and mounting the cover member on the case body.

According to the method of manufacturing the electronic unit, the first and second electronic units in which the substrates having different sizes (surface areas) are accommodated can be produced efficiently by using the common electronic unit cases. Therefore, contribution to reduction of cost of the electronic unit such as the vehicle-mounted electronic control unit (ECU), alleviation of a burden of component management, and improvement of assemblability is achieved.

INDUSTRIAL APPLICABILITY

As described above, the electronic unit case and the method of manufacturing the electronic unit according to the present invention allow effective production of two types of electronic unit in which the substrate having different sizes (surface areas) are accommodated, and are effective in afield of manufacture of the electronic control unit to be mounted on the vehicle.

The invention claimed is:

1. An electronic unit case which provides an electronic unit together with one of a first substrate and a second substrate, the electronic unit case having a shape allowing selective accommodation of either one of the first substrate and the second substrate, the first substrate having a first reference side, a first opposed side parallel to the first reference side and opposing the first reference side, and a pair of first lateral sides extending between the first reference side and the first opposed side in the direction orthogonal to the first reference side and the first opposed side and opposing each other, and allowing mounting of a first connector for external connection along the first reference side, and the second substrate having a second reference side and a second opposed side equivalent to the first reference side and the first opposed side, and a pair of second lateral sides extending between the second reference side and the second opposed side in the direction orthogonal to the second reference side and the second opposed side, opposing each other, and having a dimension larger than that of the first lateral sides, and allowing mounting of a second connector for external connection in a relative positional relationship with respect to the second reference side equivalent to the relative positional relationship between the first reference side and the first connector, the electronic unit case comprising:

a case body opening in the direction parallel to the direction of normal lines of the first substrate and the second substrate, and having a shape configured to restrain either one of the first substrate and the second substrate in the direction orthogonal to the direction of the normal lines;

a cover member configured to be mounted on the case body so as to close the opening, wherein the case body includes:

a bottom wall portion having a surface area configured to selectively accommodate one of the first substrate and the second substrate, and the bottom wall portion including a substrate supporting portion configured to support the accommodated substrate from the side opposite from the opening; and a peripheral wall portion extending upright from the bottom wall portion and having a shape configured to surround either one of the first substrate and the second substrate;

the peripheral wall portion includes:

a reference wall portion configured to come into abutment with the first reference side or the second reference side for positioning the same;

a pair of side wall portions configured to come into abutment with the first lateral sides or the second lateral sides for positioning the same;

a first restraint portion configured to restrain the first substrate in cooperation with the reference wall portion by coming into abutment with the first opposed side of the first substrate at a position where the first reference side of the first substrate comes into abutment with the reference wall portion; and a second restraint portion located at a position farther from the reference wall portion than the first restraint portion and configured to restrain the second substrate in cooperation with the reference wall portion by coming into abutment with the second opposed side of the second substrate at a position where the second reference side of the second substrate comes into abutment with the reference wall portion, wherein the first restraint portion has a discontinuous shape between both side wall portions and a shape allowing the second substrate to continue in the direction parallel to the second lateral sides in an area where the first restraint portion is not present, and wherein an upper edge of the first restraint portion is configured to be positioned vertically higher than an upper surface of the first substrate, with respect to the bottom wall portion of the case body, when the first substrate is accommodated within the electronic unit case.

2. The electronic unit case according to claim 1, wherein the first restraint portion includes a pair of restraining projecting portions projecting inward respectively from the inner side surfaces of the both side wall portions, and the restraining projecting portions have a shape configured to come into abutment respectively with both end portions of the first opposed side of the first substrate, thereby restraining the first substrate in cooperation with the reference wall portion, and allowing the second substrate to continue in the direction parallel to the second lateral sides in an area between the restraining projecting portions.

3. The electronic unit case according to claim 1, wherein the first restraint portion includes a first pressing portion located at a position where the distance from the reference wall portion is smaller than the dimension of the first lateral sides and capable of being resiliently deformed from this position in the direction away from the reference wall portion, and the first pressing portion allows the first substrate to be press-fitted into a space between the first pressing portion and the reference wall portion by the resilient deformation and presses the press-fitted substrate against the reference wall portion by a resilient restoration force of the first pressing portion.

4. The electronic unit case according to claim 1, wherein the second restraint portion includes a second pressing portion located at a position where the distance from the reference wall portion is smaller than the dimension of the second lateral sides and capable of being resiliently deformed from this position in the direction away from the reference wall portion, and the second pressing portion allows the second substrate to be press-fitted into a space between the second pressing portion and the reference wall portion by the resilient deformation and presses the press-fitted second substrate against the reference wall portion by a resilient restoration force of the second pressing portion.

5. The electronic unit case according to claim 1, wherein one of the pair of the side wall portions includes a third pressing portion located at a position where the distance from the other side wall portion is smaller than the dimensions of the first reference side and the second reference side and capable of being resiliently deformed from this position in the direction away from the other side wall portion, and the third pressing portion allows the first substrate or the second substrate to be press-fitted into a space between the third pressing portion and the other side wall portion by the resilient deformation and presses the press-fitted first or second substrate against the other side wall portion by a resilient restoration force of the third pressing portion.

6. The electronic unit case according to claim 1, wherein the cover member is provided with a press-down portion configured to press down the substrate toward the substrate supporting portion at a position opposing the substrate supporting portion.

7. A method of manufacturing a first electronic unit and a second electronic unit, comprising:

a case step manufacture for manufacturing the electronic unit case according to claim 1;

a first substrate manufacture for manufacturing the first substrate, the first substrate including the first reference side and the first opposed side having a dimension which allows press-fitting into a space between the pair of side wall portions of the case body of the electronic unit case, and the pair of first lateral sides have a dimension which allows press-fitting into a space between the reference wall portion and the first restraint portion of the case body;

a second substrate manufacture for manufacturing the second substrate, the second substrate including the pair of second lateral sides having a dimension which allows press-fitting into a space between the reference wall portion and the second restraint portion of the case body of the electronic unit case, the second substrate being formed with a notch or an opening which is capable of avoiding interference with the first restraint portion of the case body;

a first unit assembly for assembling the first electronic unit in which the first substrate is accommodated by press-fitting the first substrate inside the reference wall portion, the first restraint portion, and the pair of side wall portions in a state in which the first reference side is in abutment with the reference wall portion, and mounting the cover member on the case body; and a second unit assembly for assembling the second electronic unit in which the second substrate is accommodated by press-fitting the second substrate inside the reference wall portion, the second restraint portion and the pair of side wall portions in a state in which the second reference side is in abutment with the reference wall portion, and mounting the cover member on the case body.

* * * * *